(12) United States Patent
Johnson et al.

(10) Patent No.: US 10,340,801 B2
(45) Date of Patent: Jul. 2, 2019

(54) DECENTRALIZED OSCILLATOR-BASED CONVERTER CONTROL

(71) Applicants: Alliance for Sustainable Energy, LLC, Golden, CO (US); Regents of the University of Minnesota, Minneapolis, MN (US); ETH Zürich, Zürich (CH)

(72) Inventors: Brian Benjamin Johnson, Seattle, WA (US); Miguel Rodriguez, Golden, CO (US); Mohit Sinha, St. Paul, MN (US); Sairaj Vijaykumar Dhople, Minneapolis, MN (US); Florian Anton Dörfler, Zürich (CH)

(73) Assignees: Alliance for Sustainable Energy, LLC, Golden, CO (US); Regents of the University of Minnesota, Minneapolis, MN (US); ETH Zürich, Zürich (CH)

( * ) Notice: Subject to any disclaimer, the term of this patent is extended or adjusted under 35 U.S.C. 154(b) by 0 days.

(21) Appl. No.: 15/973,161

(22) Filed: May 7, 2018

(65) Prior Publication Data

US 2018/0323714 A1    Nov. 8, 2018

Related U.S. Application Data

(60) Provisional application No. 62/502,215, filed on May 5, 2017.

(51) Int. Cl.
*G05F 1/565* (2006.01)
*G05F 1/575* (2006.01)
(Continued)

(52) U.S. Cl.
CPC ........... *H02M 3/1584* (2013.01); *H02M 1/08* (2013.01); *H03B 5/08* (2013.01); *G05F 1/565* (2013.01);
(Continued)

(58) Field of Classification Search
CPC ............... G05F 1/565; G05F 1/575; H02M 2001/0009; H02M 3/157; H02M 3/1584
(Continued)

(56) References Cited

U.S. PATENT DOCUMENTS 8,093,758 B2   1/2012  Hussmann et al.
8,964,424 B2   2/2015  Sakakibara
(Continued)

FOREIGN PATENT DOCUMENTS

WO    2017/190002 A1    11/2017

OTHER PUBLICATIONS

"Telecom Power System Market by Grid Type (on Grid, Off Grid, Bad Grid), Component (Rectifier, Inverter, Converter, Controller, Generator), Power Source (Diesel-Battery, Diesel-Solar, Diesel-Wind, Multiple Sources), and Geography—Global Forecast to 2022", Markets and Markets, published Mar. 2017, available at https://www.marketsandmarkets.com/Market-Reports/telecom-power-system-market-218058881.html, accessed Jun. 6, 2018, pp. 1-4.
(Continued)

*Primary Examiner* — Gary A Nash
(74) *Attorney, Agent, or Firm* — Robert G. Pittelkow

(57) ABSTRACT

A device includes a control unit that includes an oscillator circuit. The control unit is configured to generate, based on the oscillator circuit, at least one switching signal. The device also includes a direct current (DC)-to-DC conversion circuit comprising at least one electronic switch that is operatively coupled to the control unit. The DC-to-DC conversion circuit is configured to convert, based on the at least one switching signal, a DC input voltage to a DC output voltage, and the control unit is further configured to input, to the oscillator circuit, a current signal that is generated based on a measured output current of the DC-to-DC conversion circuit.

18 Claims, 6 Drawing Sheets

(51) Int. Cl.
| | |
|---|---|
| H02M 3/157 | (2006.01) |
| H02M 3/158 | (2006.01) |
| H03B 5/08 | (2006.01) |
| H02M 1/08 | (2006.01) |
| H02M 1/00 | (2006.01) |

(52) U.S. Cl.
CPC ............. *G05F 1/575* (2013.01); *H02M 3/157* (2013.01); *H02M 2001/0009* (2013.01)

(58) Field of Classification Search
USPC ........ 323/241, 272, 274, 275, 280, 283–285
See application file for complete search history.

(56) References Cited

U.S. PATENT DOCUMENTS

| | | | |
|---|---|---|---|
| 9,484,745 B2 | 11/2016 | Johnson et al. | |
| 2011/0110132 A1* | 5/2011 | Rausch ............... | H02M 1/4225 363/124 |
| 2011/0115454 A1* | 5/2011 | Benedict ............... | H02M 3/156 323/282 |
| 2011/0169471 A1* | 7/2011 | Nagasawa ........... | H02M 3/1584 323/283 |
| 2013/0241511 A1* | 9/2013 | Xi ......................... | H02M 3/158 323/283 |
| 2014/0176097 A1* | 6/2014 | Huang ................... | G05F 1/59 323/272 |
| 2015/0009719 A1* | 1/2015 | Ho ...................... | H02M 3/33507 363/21.13 |
| 2015/0188406 A1* | 7/2015 | Nishi ................... | H02M 3/1584 323/217 |
| 2017/0316135 A1 | 11/2017 | Johnson et al. | |

OTHER PUBLICATIONS

"Data Center Power Market Analysis by Product (PDU, UPS, Busway), by End-use (IT & Telecommunications, BFSI, Government, Energy, Healthcare, Retail), by Region, and Segment Forecasts, 2018-2025", Grand View Research, published Jul. 2017, available at https://www.grandviewresearch.com/industry-analysis/data-center-power-market, accessed Jun. 5, 2018, pp. 1-9.

"DC-DC Converters Market worth 268.2 Million USD by 2020", Press Release, Markets and Markets, available at https://www.marketsandmarkets.com/PressReleases/dc-dc-converter.asp, accessed Jun. 5, 2018, pp. 1-3.

Haug, "Multiphase DC/DC Converters Save Power in Data Centers", Power Electronics Europe, 2011, Issue 5, pp. 33-35.

Krein, "Data Center Challenges and Their Power Electronics", CPSS Transactions on Power Electronics and Applications, Mar. 2017, vol. 2, No. 1, pp. 39-46.

Sinha et al., "Decentralized Interleaving of Paralleled Dc-Dc Buck Converters", 2017 IEEE 18th Workshop on Control and Modeling for Power Electronics (COMPEL), Jul. 2017, pp. 1-6.

Dhople et al., "Virtual Oscillator Control for Voltage Source Inverters", IEEE Fifty-first Annual Allerton Conference, Oct. 2013, pp. 1359-1363.

Dumitrescu et al., "Modeling and characterization of oscillator circuits by Van Der Pol model using parameter estimation", Journal of Circuits, Systems, and Computers, Feb. 2012, pp. 1-15.

Johnson, "Control, Analysis, and Design of Distributed Inverter Systems", Dissertation, University of Illinois at Urbana-Champaign, 2013, pp. 1-150.

Johnson et al., "Oscillator-Based Inverter Control for Islanded Three-Phase Microgrids", IEEE Journal of Photovoltaics, Jan. 2014, vol. 4, No. 1, pp. 387-395.

Johnson et al., "Synthesizing Virtual Oscillators to Control Islanded Inverters", IEEE Transactions on Power Electronics, Aug. 2016, vol. 31, No. 8, pp. 6002-6015.

Sinha et al., "Nonlinear Supersets to Droop Control", 2015 IEEE 16th Workshop on Control and Modeling for Power Electronics (COMPEL), Jul. 2015, pp. 1-6.

Sinha et al., "Synchronization of Liénard-type Oscillators in Uniform Electrical Networks", 2016 American Control Conference (ACC), Jul. 2016, pp. 4311-4316.

International Search Report and Written Opinion for International (PCT) Application No. PCT/US17/30119, pp. 1-10, dated Sep. 22, 2017.

* cited by examiner

DECENTRALIZED OSCILLATOR-BASED CONVERTER CONTROL

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Direct Current (DC) microgrids have emerged as a compelling application for the integration of renewable energy sources as they can be designed to offer high efficiency and reliability. DC microgrid architectures are typically comprised of converter-interfaced distributed generators whose outputs are connected to a common DC bus that serves a collection of loads. Such converter-interfaced distributed generation is also used in a number of other areas, such as data center power provision, CPU power supplies, voltage regulator modules, power-factor correction circuits, and DC front-end converters in renewable energy systems.

Power quality in parallel converter systems can be enhanced with switch interleaving techniques, such that the pulse width modulation (PWM) carriers of the converters are uniformly interspersed across a given switch cycle. The periodic switching action among converters can also lead to current ripple cancellation at the load bus.

SUMMARY

In one example, a device includes a control unit having an oscillator circuit. The control unit is configured to generate, based on the oscillator circuit, at least one switching signal. The device also includes a direct current (DC)-to-DC conversion circuit having at least one electronic switch that is operatively coupled to the control unit. The DC-to-DC conversion circuit is configured to convert, based on the at least one switching signal, a DC input voltage to a DC output voltage and the control unit is further configured to input, to the oscillator circuit, a current signal that is generated based on a measured output current of the DC-to-DC conversion circuit.

In another example, a system includes a first DC conversion device and a second DC conversion device. The first DC conversion device includes a first control unit having a first oscillator circuit. The first control unit is configured to generate, based on the first oscillator circuit, at least one first switching signal. The first DC conversion device also includes a first direct current (DC)-to-DC conversion circuit having a first at least one electronic switch that is operatively coupled to the first control unit. The first DC-to-DC conversion circuit is configured to convert, based on the at least one first switching signal, a first DC input voltage to a first DC output voltage, and the first control unit is further configured to input, to the first oscillator circuit, a first current signal that is generated based on a measured output current of the first DC-to-DC conversion circuit. The second DC conversion device includes a second control unit having a second oscillator circuit. The second control unit is configured to generate, based on the second oscillator circuit, at least one second switching signal. The second DC conversion device also includes a second DC-to-DC conversion circuit having a second at least one electronic switch that is operatively coupled to the second control unit. The second DC-to-DC conversion circuit is configured to convert, based on the at least one second switching signal, a second DC input voltage to a second DC output voltage, and the second control unit is further configured to input, to the second oscillator circuit, a second current signal that is generated based on a measured output current of the second DC-to-DC conversion circuit. The first DC conversion device and the second DC conversion device are configured in parallel to output power to a load.

The details of one or more examples are set forth in the accompanying drawings and the description below. Other features, objects, and advantages will be apparent from the description and drawings, and from the claims.

DETAILED DESCRIPTION

The present disclosure provides systems, devices, and methods for switch interleaving via decentralized control. The control unit of each device is based on the digital execution of a nonlinear oscillator circuit and uses a locally measured current to construct a pulse width modulation (PWM) carrier waveform. For example, local control units of a system may include a Liénard-type nonlinear oscillator, where the oscillator's periodic trajectory is used to create a triangular carrier with identical frequency and phase. By virtue of the intrinsic electrical coupling, the techniques described herein may allow the oscillator-based control units to converge to the interleaved state with uniform phase-spacing across carriers (e.g., the switching period).

By providing fully-decentralized interleaving, the techniques described herein may essentially enable plug-and-play functionality, providing modularity, reliability, and resiliency in power provision. This may be useful in numerous situations, such as in mission-critical systems, where redundant power sources and/or easy replacement are important. As one example, the decentralized control techniques of the present disclosure may be used in data centers to manage incoming power for racks, servers, and other components in an easily reconfigurable fashion. Other areas that may benefit from the decentralized control techniques disclosed herein include microgrids and naval systems that contain systems of parallel-connected converters as well as photovoltaic and battery systems where ripple reduction enhances system performance.

In related art approaches, switch interleaving may be accomplished via centralized implementations that manage system-wide timing among PWM carrier waveforms. Although centralized solutions may be appropriate for systems that contain a fixed number of converters, they are simply inadequate for modular plug-and-play systems with ad-hoc structures such as microgrids. To address this need, the present disclosure provides fully decentralized techniques for obtaining system-wide interleaving. Specifically, the techniques presented herein utilize locally executed, nonlinear control that acts as a carrier wave generator, wherein each control unit only uses local measurements. The present disclosure also shows that such techniques, along with the intrinsic network coupling between the converters, give rise to the interleaved condition in steady-state.

In various examples, the techniques of the present disclosure may be employed in a variety of different systems that use parallel-connected DC-DC converters. In some examples, the techniques described herein may be used in conjunction with other methods, such as _____. As one concrete example, the present disclosure describes these techniques within the context of a parallel-connected DC-DC converter system. Various other examples and embodiments will be apparent to those skilled in the art and are within the scope of this disclosure.

Figure 1:
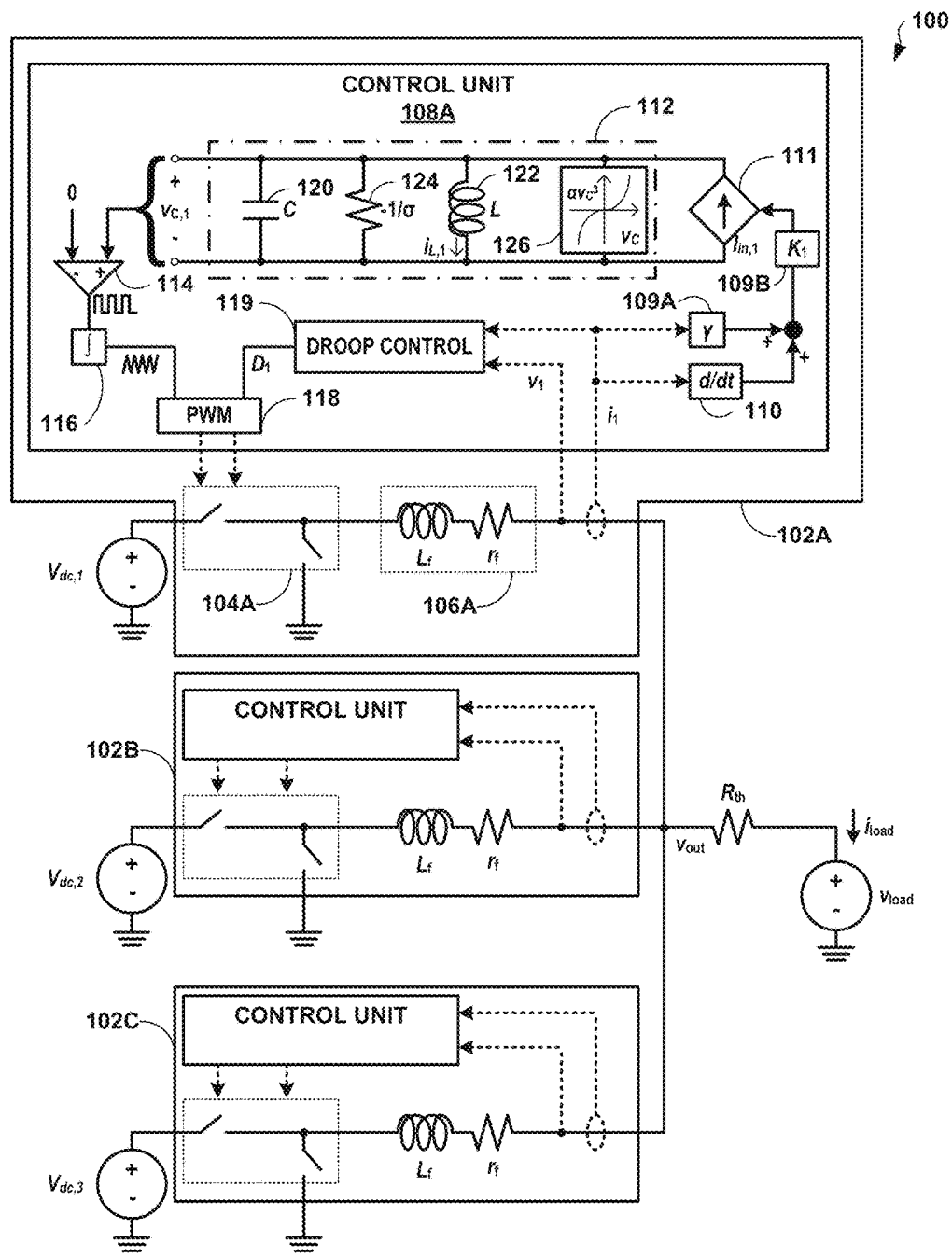
FIG. 1 is a conceptual diagram illustrating an example system of parallel-connected buck converters with decentralized controllers, in accordance with one or more aspects of the present disclosure.

FIG. 1 is a conceptual diagram illustrating an example system (e.g., system 100) of parallel-connected buck converters with decentralized controllers, in accordance with one or more aspects of the present disclosure. System 100 represents only one example of a converter system implemented using the decentralized control techniques described herein, and various other structures and configurations may be used in other examples. For example, other converter systems may include more or fewer components than, or alternative components to those shown in the example of FIG. 1.

In the example of FIG. 1, system 100 includes converters 102A, 102B, and 102C (collectively "converters 102"). In other examples, system 100 may include any other number of converters 102. That is, the techniques described herein may be applied in systems having one or more of converters 102. In the example of FIG. 1, only converter 102A is illustrated in detail. Converters 102B and 102C are substantially the same as converter 102A. Differences, if any, will be specifically enumerated herein.

In the example of FIG. 1, converter 102A includes electronic switches 104A and output filter 106A. Together, electronic switches 104A and output filter 106A may represent a DC-to-DC conversion circuit. Output filter 106A is represented in FIG. 1 as an inductance, $L_f$ and a resistance, $r_f$. Electronic switches 104A and output filter 106A may operate in a well-known fashion as a buck converter. For instance, electronic switches 104A may be activated and deactivated (e.g., according to a duty cycle) to control the voltage across output filter 106A, thereby effectively converting a DC input signal (e.g., having a first voltage) to a DC output signal (e.g., having a second voltage). While shown in the example of FIG. 1 as a pair of switches, electronic switches 104A may, in other examples, represent a single switch and a passive component, such as a diode. In other words, electronic switches 104A may represent one or more components or devices capable of engaging and disengaging according to one or more switching signals received from a control unit. For example, electronic switches 104A may include semiconductor devices, such as transistors, or other suitable components.

In the example of FIG. 1, converter 102A includes control unit 108A. In some examples, control unit 108A may be a processor, such as a microcontroller, a digital signal processor (DSP), a field-programmable gate array (FPGA) or other suitable device configured to implement virtual components in accordance with the techniques described herein. In some examples, control unit 108A may be a collection of physical components (e.g., any number of capacitors, inductors, resistors, transistors, etc.) configured in accordance with the techniques described herein. In other examples, control unit 108A may be a combination of one or more processors and one or more physical components, configured in accordance with the techniques of the present disclosure. In some examples, control unit 108A may represent multiple devices configured to work together to implement the techniques described herein. That is, while shown as a single control unit in the example of FIG. 1, control unit 108A may be a collection of processors and/or other components, in some examples.

In the example of FIG. 1, where control unit 108A represents a processor, control unit 108A may digitally emulate a discretized nonlinear oscillator (e.g., virtual oscillator 112). Virtual oscillator 112 may, in some examples, represent a nonlinear Liénard-type oscillator.

In the example of FIG. 1, virtual oscillator 112 comprises a parallel connection of capacitor 120, inductor 122, negative-conductance element 124, and cubic voltage-dependent current source 126. That is, components 120, 122, 124, and 126 are virtual representations of physical components. The emulated inductive and capacitive elements of capacitor 120 and inductor 122, C and L respectively, may be selected such that $\sqrt{L/C} \ll 1$, which ensures that the oscillator voltage, $v_{C,1}$ is nearly sinusoidal. Negative-conductance element 124 may have a conductance value of $-\sigma$. A current through inductor 122 is denoted by $i_{L,1}$, and a current consumed by cubic voltage-dependent current source 126 is given by $\alpha v_C^3$, where $\alpha$ is a positive real constant.

While described with respect to FIG. 1, as emulating a virtual oscillator circuit by emulating virtual components, control unit 108A may, in other examples, include a physical oscillator circuit that is made up of physical components (e.g., a capacitor, inductor, negative-conductance element, and cubic voltage-dependent current source). These physical components may be discrete components, part of one or more integrated circuits, or otherwise physically implemented.

In the example of FIG. 1, a locally measured current ripple is provided as an input (e.g., via current source 111) to virtual oscillator 112, and its states are subsequently used to generate a triangular PWM carrier wave for converter 102A. Virtual oscillator 112 is coupled to the outputted current of converter 102A through current-scaling units 109A and 109B (using scaling factor values $\gamma$ and $\kappa_1$, respectively) and derivative unit 110. Specifically, current-scaling unit 109A receives an output current of converter 102A, i, and multiplies the received signal by $\gamma$. Derivative unit 110 may also receive the output current of converter 102A and determine its derivative. Current-scaling unit 109B may receive a combination of these two outputs and scale the received signal by $\kappa_1$. The resulting current may then be inputted into virtual oscillator circuit 112 by current source 111.

Current-scaling units 109A and 109B, derivative unit 110, and current source 111 may, in various examples, be digitally emulated by a processor, may be physical components, or may be some combination thereof. That is, in some examples, components 109A, 109B, 110, and 111 may represent a processor configured with instructions to implement virtual current-scaling units a virtual derivative unit, and a virtual current source. In other examples, components 109A, 109B, 110, and 111 may be made of physical devices, such as transistor-based circuits, or other suitable physical components. In yet other examples, components 109A, 109B, 110, and/or 111 may be implemented in other ways.

In some examples, the scaling factor values used by all of converters 102 may be the same. In some examples, either or both of γ and κ may be specific to each converter. The current injected into the emulated oscillator of the j-th one of converters 102, denoted $i_{in,j}$, may thus be given by $$i_{in,j} = \kappa_j \left( \gamma i_j + \frac{di_j}{dt} \right) \quad (1)$$

where $\gamma, \kappa_j \in \mathbb{R}$ are the scaling factor values.

In the example of FIG. 1, control unit 108A includes comparator 114 and integrator 116. Comparator 114 and integrator 116 may act in series on $v_{C,1}$ (the voltage across capacitor 120) to generate a PWM carrier wave. Specifically, comparator 114 may compare $v_{C,1}$ to a reference voltage (e.g., 0) to create a square wave. Integrator 116 may integrate the square wave to produce the PWM carrier wave. Note that the zero crossings of $v_{C,1}$ coincide with the PWM carrier wave zero crossings. Hence, the PWM carrier wave follows the same phase and frequency as the emulated oscillator voltage.

In the example of FIG. 1, control unit 108A includes PWM 118. PWM 118 may be configured to use the PWM carrier wave to generate switch pulses for electronic switches 106A in a typical fashion. For example, PWM 118 may represent a comparator and associated logic that receives the PWM carrier wave and a duty ratio and produces the switch pulses. Note that the switching frequency outputted by control unit 108A coincides with the resonant frequency of virtual oscillator 112 and is given by $\omega_{SW}=1/\sqrt{LC}$ where the switching period is $T_{SW}=2\pi/\omega_{SW}$.

Comparator 114, integrator 116, and/or PWM 118 may, in various examples, be digitally emulated by a processor, may be physical components, or may be some combination thereof. That is, in some examples, components 114, 116, and 118 may represent a processor configured with instructions to implement a virtual comparator, a virtual integrator, and a virtual PWM. In other examples, components 114, 116, and 118 may be made of physical devices, such as an op-amp comparator circuit, an op-amp integrator circuit, and an op-amp based PWM, or other suitable physical components and circuits. In yet other examples, components 114, 116, and/or 118 may be implemented in other ways.

The structure for carrier generation described herein is independent of the controller that yields the duty ratio, $D_j$ (for the j-th one of converters 102). That is, the duty ratio can be generated by any controller (e.g., current or voltage controllers). To showcase a fully decentralized system, a prototypical droop controller (e.g., droop controller 119) is shown in the example of FIG. 1 to obtain automatic load sharing. Droop controller 119 generates $D_1$ for converter 102A. While a droop controller is shown in the example of FIG. 1, the techniques of the present disclosure may, in various examples, utilize any suitable component(s) or device(s) capable of generating a duty cycle. That is, droop controller 119 is only one example component usable to provide a duty cycle for use as described herein, and other examples will be readily understood to those skilled in the art.

Similar to other components of control unit 108A, the controller generating a duty ratio may be physically implemented, digitally implemented, or implemented using some combination of physical components and digital emulation. Furthermore, the controller generating the duty ratio may, in some examples, be separate from the rest of control unit 108A. That is, while shown in the example of FIG. 1 as a part of control unit 108A, component 119 may, in other examples, be separate from (but operatively connected to) control unit 108A.

In the example of FIG. 1, each of converters 102 has a DC input signal, $v_{dc,j}$. Converters 102 are connected in parallel to a load. The load in FIG. 1 is modeled as a voltage source, $v_{load}$, behind a Thevenin resistance, $R_{th}$.

In system 100, the local droop controllers of converters 102 modulate the duty ratio for decentralized load sharing and the control units of converters 102 yield switch interleaving without communication. This representative system represents the first fully decentralized strategy for switch interleaving of parallel converters and in multi-converter systems in general. In contrast, various related-art solutions are distributed in nature and, at best, use a communication bus to ensure interleaving across converters.

The techniques described herein may serve as the foundational theory for decentralized switch coordination in generalized multi-converter systems. A model of the parallel converter system is introduced below, it is shown that the interleaved system state is stable, and a set of simulation results is presented. The techniques described herein may be applied in multiphase and cellular architectures as well.

To analyze the phase dynamics that lead to interleaving, it is necessary to develop a model of the virtual oscillator, as shown in FIG. 1, that is written in terms of its angle. Towards that end, begin with Kirchoff's laws to obtain the following dynamics at the j-th virtual oscillator in each control unit $$L\frac{di_{L_j}}{dt} = v_{C_j}; \quad C\frac{dv_{C_j}}{dt} = (\sigma v_{C_j} - \alpha v_{C_j}^3) - i_{L_j} + i_{in,j}. \quad (2)$$

Next define $\varepsilon=\sqrt{L/C}$, $x_j=\varepsilon i_{L_j}$, and $y_j=v_{C_j}$, such that the oscillator dynamics written as $$\dot{x}_j = \omega_{SW} y_j; \quad \dot{y}_j = -\omega_{SW} x_j + \varepsilon(\sigma y_j - \alpha y_j^3) + \varepsilon i_{in,j}, \quad (3)$$

Where $x_j$ and $y_j$ define orthogonal signals on a phase plot.

Figure 2:
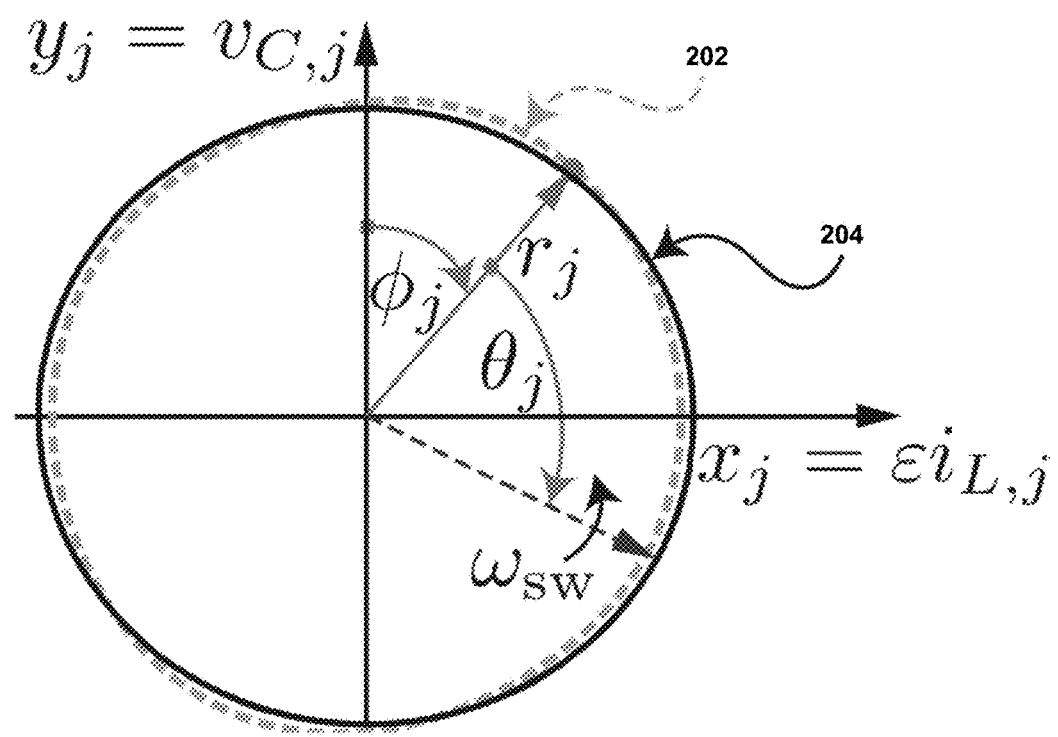
FIG. 2 is a graphical plot illustrating the orthogonal signals $x_j$ and $y_j$ as described with respect to FIG. 1.

FIG. 2 is a graphical plot illustrating the orthogonal signals $x_j$ and $y_j$, as described above with respect to FIG. 1. The emulated inductor current and capacitor voltage in the j-th oscillator are used to define polar coordinates. These quantities define a nearly circular trajectory (e.g., line 202) in the polar plot with amplitude $r_j$ and angle $\phi_j$. Here, $\phi_j$ defines the offset from the nominal angle $\omega_{SW} t$, where $\omega_{SW}=\sqrt{1/LC}$ equals the oscillator resonant frequency. This trajectory is averaged over one cycle to obtain the averaged quantities and $\bar{r}_j$ and $\bar{\phi}_j$. Line 204 represents the averaged trajectory.

To extract the phase dynamics, define the amplitude, $r_j=\sqrt{x^2+y^2}$ and instantaneous angle $\phi_j=\arctan(x/y)$. Rather than analyze the instantaneous phase dynamics, focus on the phase offset angle $\theta_j=\phi_j-\omega_{SW} t$, which quantifies the angle difference with respect to a nominal reference frame. These magnitude and phase offset dynamics are governed by $$\dot{r}_j = \varepsilon\omega_{SW}(\sigma r_j \cos(\omega_{SW} t + \theta_j) - \alpha r_j^3 \cos^3(\omega_{SW} t + \theta_j))\cos(\omega_{SW} t + \theta_j) + \quad (4)$$
$$\varepsilon\omega_{SW} i_{in,j} \cos(\omega_{SW} t + \theta_j)$$

$$\dot{\theta}_j = -\varepsilon\omega_{SW}(\sigma \cos(\omega_{SW} t + \theta_j) - \alpha r_j^2 \cos^3(\omega_{SW} t + \theta_j)) -$$
$$\frac{\varepsilon\omega_{SW}}{r_j} i_{in,j} \sin(\omega_{SW} t + \theta_j).$$

Given that the expressions in (4) are rather unwieldy, it may be beneficial to average them over one switching cycle to obtain the following cycle-averaged model $$\dot{\bar{r}}_j = \frac{\varepsilon\omega_{SW}}{2}(\sigma\bar{r}_j - 3\alpha\bar{r}_j^3) + \frac{\varepsilon\omega_{SW}^2}{2\pi}\int_0^{2\pi/\omega_{SW}} i_{in,j}\cos(\omega_{SW}t + \bar{\theta}_j)dt; \quad (5)$$

$$\dot{\bar{\theta}}_j = -\frac{\varepsilon\omega_{SW}^2}{2\pi\bar{r}_j}\int_0^{2\pi/\omega_{SW}} i_{in,j}\sin(\omega_{SW}t + \bar{\theta}_j)dt.$$

where $\bar{r}_j$ and $\bar{\theta}_j$ are the averaged model states. It can be shown that since $\varepsilon \ll 1$, the oscillator dynamics vary slowly, and thus, the averaged model provides sufficient accuracy with bounded error.

Multi-converter system 100, as shown in FIG. 1, may be said to be in the interleaved state if $$\bar{\theta}_j = j\frac{2\pi}{N} + \bar{\phi}_j (\bmod 2\pi),\ j \in \{1, \ldots, N\},\ 0 \le \phi \le 2\pi \quad (6)$$

where, recall, $\bar{\theta}_j$ is the angle of the j-th oscillator waveform, $v_{C,j}$, and its corresponding carrier waveform. Having established the individual oscillator model above, now analyze the network coupling. Denote the switching signal of the j-th buck converter as $S_j \in \{0,1\}$. The circuit equations can then be written as:

$$v_{dc,j}S_j(t) - v_{out} = r_f i_j(t) + L_f\frac{di_j}{dt} \text{ for } j \in \{1, \ldots, N\}; \quad (7)$$

$$v_{out} = R_{Th}\sum_{j=1}^{N} i_j + v_{load}$$

Defining $i_{load} := \sum_{j=1}^{N} i_j$, and summing the individual circuit equations yields $$(r_f + NR_{Th})i_{load} + L_f\frac{di_{load}}{dt} = v_{dc,j}\sum_{j=1}^{N} S_j(t) - Nv_{load}. \quad (8)$$

If the current feedback gain is picked as $\gamma = r_f/L_f$ and (1)-(8) are substituted into (4), this results in $$\dot{\bar{r}} = \frac{\varepsilon\omega_{SW}}{2}(\sigma\bar{r}_j - 3\alpha\bar{r}_j^3) + \frac{\varepsilon\omega_{SW}^2}{2\pi L_f}\int_0^{2\pi/\omega_{SW}} v_{dc,j}S_j(t)\cos(\omega_{SW}t + \bar{\theta}_j) - \quad (9)$$

$$R_{Th}i_{load}\cos(\omega_{SW}t + \bar{\theta}_j)dt$$

$$\dot{\bar{\theta}}_j = -\frac{\varepsilon\omega_{SW}^2}{2\pi\bar{r}_jL_f}\int_0^{\frac{2\pi}{\omega_{SW}}} v_{dc,j}S_j(t)\sin(\omega_{SW}t + \bar{\theta}_j)dt +$$

$$\frac{\varepsilon\omega_{SW}^2 R_{Th}}{2\pi\bar{r}_jL_f}\int_0^{2\pi/\omega_{SW}} i_{load}\sin(\omega_{SW}t + \bar{\theta}_j)dt$$

Using Fourier analysis, the PWM switch signal can be written as the following series for a particular duty ratio $$S_k(t) = D_k + \sum_{m=1}^{\infty}\frac{2}{m\pi}\sin(D_k m\pi)\cos(m(\omega_{SW}t + \theta_k)). \quad (10)$$

Here, it is assumed that the duty-ratio commands vary on a much lower timescale in comparison to the switching period. For system 100 of FIG. 1, this implies that the droop controllers maintain roughly constant duty ratios over a switch cycle. As converters 102 are connected in parallel, the following can be obtained in steady-state $$v_{dc,j}D_j = v_{dc,k}D_k. \quad (11)$$

Inserting (10)-(11) into (9) arrives at the coupled oscillator model $$\dot{\bar{r}}_j = \frac{\varepsilon\omega_{SW}}{2}(\sigma\bar{r}_j - 3\alpha\bar{r}_j^3) + \quad (12)$$

$$\frac{2\varepsilon\omega_{SW}v_{dc,j}\kappa_j\sin(D_j\pi)}{\pi L_f} + \frac{2\varepsilon\omega_{SW}v_{dc,j}R_{Th}\kappa_j\sin(D_j\pi)}{\pi L_f((\omega_{SW}L_f)^2 + (r_f + NR_{Th})^2)}$$

$$\left(\omega_{SW}L_f\sum_{k=1}^{N}\sin(\bar{\theta}_j - \bar{\theta}_k) - (r_f + NR_{Th})\sum_{k=1}^{N}\cos(\bar{\theta}_j - \bar{\theta}_k)\right)$$

$$\dot{\bar{\theta}}_j = \frac{2\varepsilon\omega_{SW}v_{dc,j}R_{Th}\kappa_j\sin(D_j\pi)}{\pi\bar{r}_jL_f((\omega_{SW}L_f)^2 + (r_f + NR_{Th})^2)}$$

$$\left(\omega_{SW}L_f\sum_{k=1}^{N}\cos(\bar{\theta}_j - \bar{\theta}_k) - (r_f + NR_{Th})\sum_{k=1}^{N}\sin(\bar{\theta}_j - \bar{\theta}_k)\right)$$

It can be shown that if the angles offsets, $\bar{\theta}_j$ for $j = 1, \ldots, N$, satisfy the interleaved state in (6), then the expressions in (12) are at equilibrium (I.e., $\dot{\bar{r}}_j = \dot{\bar{\theta}}_j = 0,\ \forall j$). To establish whether the interleaved state is stable, linearize this operating point and partition the Jacobian into blocks as follows:

$$J = \begin{bmatrix} J_A & J_B \\ \hline J_C & J_D \end{bmatrix} \quad (13)$$

Since $J_C = 0$ for the interleaved state, the eigenvalues of J are the eigenvalues of $J_A$ and $J_D$, where the entries of $J_A$ and $J_D$ are given by $$[J_A]_{j\ell} = \begin{cases} \frac{\varepsilon\omega_{SW}}{2}(\sigma - 9\alpha\bar{r}_j^2) & \text{if } j = \ell \\ 0 & \text{if } j \ne \ell \end{cases} \quad (14)$$

$$[J_D]_{j\ell} = \quad (15)$$

$$\begin{cases} -K(r_f + NR_{Th}) & \text{if } j = \ell \\ K\left(\omega_{SW}L_f\sin\left(\frac{2\pi}{N}(j-\ell)\right) - (r_f + NR_{Th})\cos\left(\frac{2\pi}{N}(j-\ell)\right)\right) & \text{if } j \ne \ell \end{cases}$$

where $$K = \frac{2\varepsilon\omega_{SW}v_{dc,j}R_{Th}\kappa_j\sin(D_j\pi)}{\pi\bar{r}_{eq,j}L_f((\omega_{SW}L_f)^2 + (r_f + NR_{Th})^2)}. \quad (16)$$

Due to the structure of $J_A$ and $J_D$, it can be shown that the real parts of all eigenvalues are negative, and hence, the interleaved state is locally exponentially stable. A detailed proof of this statement has been omitted for brevity.

Next, the approach on a system of parallel converters that coincides with the structure in FIG. 1 is validated. Assume each DC supply provides 40 V to its respective one of converters 102, output filter elements are $r_f = 1\Omega$ and $L_f = 1$ mH, and the load consists of a voltage source of $v_{load} = 20$ V behind a resistance of $R_{th} = 1\Omega$. The virtual oscillators that generate the carriers are parametrized $\sigma = 1\ \Omega^{-1}$, $\alpha = 0.67$ A/V$^3$, L=0.61 µH, and C=16.67 µF, such that the oscillation and switching frequency are equal to 50 kHz. The droop controllers are implemented as a proportional-integral voltage controller such that the duty ratio is given by $D_j=k_p(V_{ref,j}-v_{out})+k_i(V_{ref,j}-v_{out})dt$ where $V_{ref,j}=V_{nom}-m_{ij}$ and m is the droop slope.

Figure 3A:
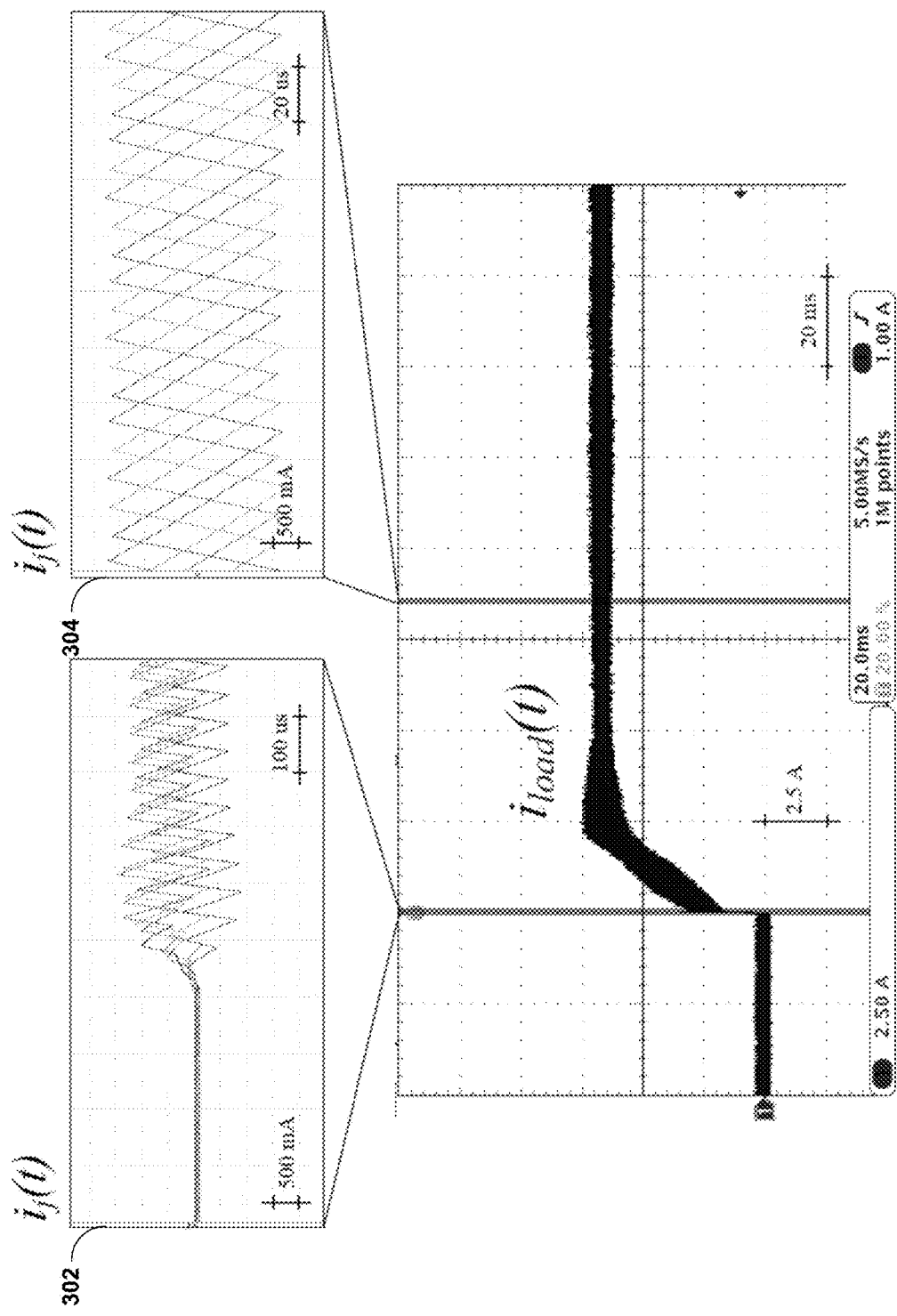
FIGS. 3A-3C are graphical plots illustrating simulation results of parallel-connected buck converters configured to implement decentralized interleaving control, in accordance with one or more aspects of the present disclosure.
Figure 3B:
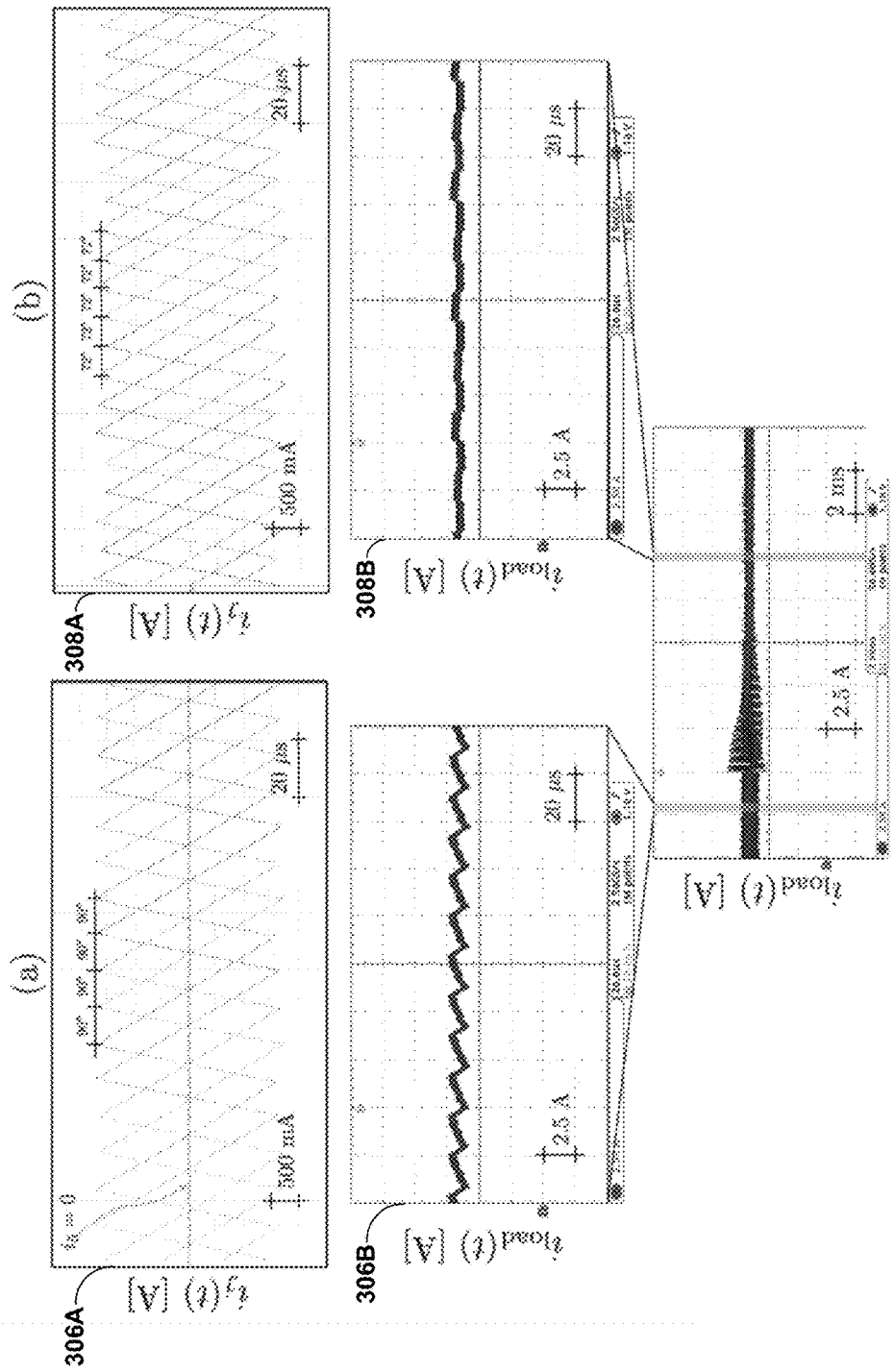
Figure 3C:
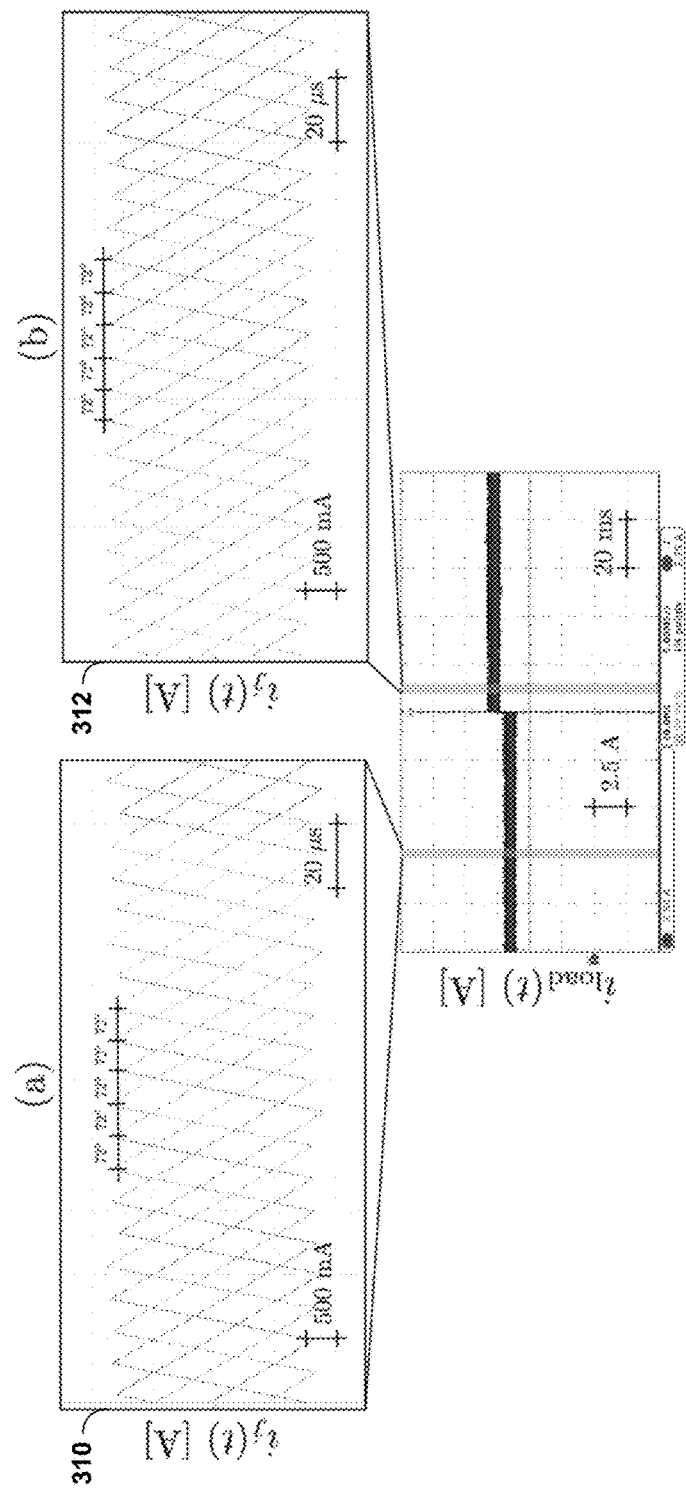

FIGS. 3A-3C are graphical plots illustrating simulation results of parallel-connected buck converters configured to implement decentralized interleaving control, in accordance with one or more aspects of the present disclosure. For instance, FIGS. 3A-3C may represent the behavior of five instances of converter 102A being connected to a load in parallel. FIG. 3A, represents the system response in a startup scenario in which five converters are initiated simultaneously, each with arbitrary initial conditions. FIG. 3A shows the dynamics of the load current and the ac components of the phase currents for this case. In the example of FIG. 3A, the phase currents, $i_j$, of the individual converters at the turn-on instant are arbitrarily spaced, which results in a larger ripple in $i_{load}$. After approximately 40 ms, the phase currents of the five converters settle to the interleaved state. Inset 302 provides further detail of the system response after the five buck converters are started from arbitrary initial conditions. Inset 304 provides further detail of the system response as it achieves symmetric interleaving with 72-degree (i.e., 360/5) phase spacing. In the example of FIGS. 3A-3C, the converters are using droop controllers. As seen in inset 304, the droop controllers maintain balanced currents in each of the five units in steady state.

FIG. 3B illustrates the plug-and-play nature of the techniques of the present disclosure. Specifically, FIG. 3B shows the system response as one additional buck converter is added to four functioning converters. Insets 306A and 306B provide further detail of the system response prior to the addition of the fifth converter, with the phase currents having 90-degree (i.e., 360/4) phase spacing. After adding an additional fifth converter, the system reaches the interleaved state in approximately 6 ms without communication. Insets 308A and 308B provide further detail of the system response after the fifth converter is added and the system again achieves symmetric interleaving with 72-degree phase spacing. The benefits of interleaving with additional units are also evident in reducing load-current ripple. Again, the droop controller successfully maintains current sharing before and after the addition of the fifth unit.

FIG. 3C illustrates a load step, which validates the robustness of the techniques described herein to typical operating transients. In FIG. 3C, the load was changed from $R_{load}=1.6\Omega$ to $R_{load}=1.3\Omega$ at t=0 with five units connected. Insets 310 and 312 provide further detail of the system response prior to and after the load change, respectively. As shown in the example of FIG. 3C, the system maintains the interleaved state before and after the transient, as indicated by the unchanged ripple magnitude in $i_{load}$ and the unchanged 72-degree phase shift in phase currents $i_j$.

Figure 4:
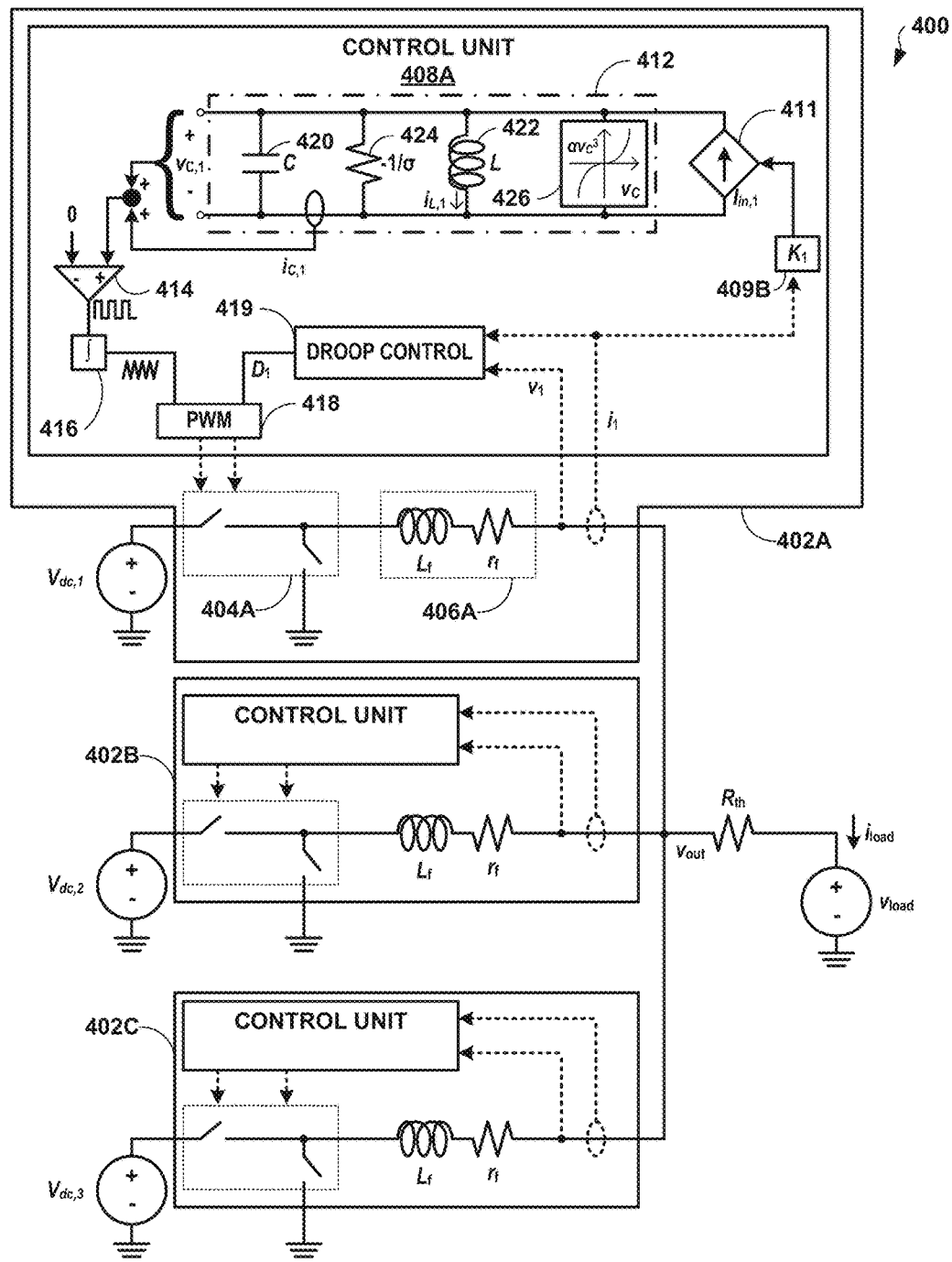
FIG. 4 is a conceptual diagram illustrating another example system of parallel-connected buck converters with decentralized controllers, in accordance with one or more aspects of the present disclosure.

FIG. 4 is a conceptual diagram illustrating another example system (e.g., system 400) of parallel-connected buck converters with decentralized controllers, in accordance with one or more aspects of the present disclosure. System 400 includes converters 402A, 402B, and 402C, electronic switches 404A, output filter 406A, control unit 408A, current scaling unit 409B, current source 411, virtual oscillator 412, comparator 414, integrator 416, PWM 418, droop controller 419, capacitor 420, inductor 422, negative-conductance element 424, and cubic voltage-dependent current source 426.

In the example of FIG. 4, the components of system 400 may be substantially similar to their respective components of system 100, as described with respect to FIG. 1. That is, components 402A, 402B, 402C, 404A, 406A, 408A, 409B, 411, 412, 414, 416, 418, 419, 420, 422, 424, and 426, as shown in the example of FIG. 4, may have substantially similar functionality to that of components 102A, 102B, 102C, 104A, 106A, 108A, 109B, 111, 112, 114, 116, 118, 119, 120, 122, 124, and 126, respectively.

As seen in the example of FIG. 4, control unit 408A (and similarly the control units for converters 402B and 402C) do not include a current scaling unit corresponding to current scaling unit 109A or a derivative unit corresponding to derivative unit 110. Instead, in the example of FIG. 4, the voltage across capacitor 420 is combined with the current through capacitor 420 and provided to comparator 414. That is, instead of comparator 414 comparing, to a reference voltage (e.g., of zero), the voltage across capacitor 420 alone, comparator 414 receives a combined signal representing the voltage across capacitor 420 combined with the current through capacitor 420.

System 400 represents an alternative implementation to system 100. The example system of FIG. 4 may be useful because derivative computation may be difficult to execute in practice. Thus, system 400 avoids a derivative unit while still providing the same functionality. That is, system 400 may, in some examples, allow additional convenience while still providing interleaving controllers and converters in accordance with the techniques described herein.

The present disclosure describes decentralized control techniques for obtaining interleaving in a system of parallel-connected converters. The approach described herein utilizes a locally executed virtual oscillator-based control unit that processes a local current measurement to generate the PWM carrier waveform. Using a system of parallel-connected buck converters with droop control as a case study, the present disclosure demonstrated interleaving without communication. In some examples, an alternate implementation may be used which offers practical recommendations for implementation.

One or more aspects of the techniques described herein may be additionally or alternatively described by one or more of the following examples.

Example 1

A device comprising: a control unit comprising an oscillator circuit, the control unit configured to generate, based on the oscillator circuit, at least one switching signal; and a direct current (DC)-to-DC conversion circuit comprising at least one electronic switch that is operatively coupled to the control unit, wherein the DC-to-DC conversion circuit is configured to convert, based on the at least one switching signal, a DC input voltage to a DC output voltage, wherein the control unit is further configured to input, to the oscillator circuit, a current signal that is generated based on a measured output current of the DC-to-DC conversion circuit.

Example 2

The device of example 1, wherein the oscillator circuit comprises a negative conductance element, an inductor, and a capacitor connected in parallel.

Example 3

The device of example 2, wherein: an inductance value, L, of the inductor and a capacitance value, C, of the capacitor are defined based on a switching frequency, such that $$\frac{1}{2\pi\sqrt{LC}}$$

is equal to the switching frequency and $0<\sqrt{L/C}<1$, a negative conductance value of the negative conductance element is a positive value.

Example 4

The device of example 2, wherein the oscillator circuit further comprises a cubic voltage-dependent current source.

Example 5

The device of example 4, wherein a coefficient of the cubic voltage-dependent current source is a positive value.

Example 6

The device of example 1, wherein: the processing unit comprises a processor configured to implement the oscillator circuit by emulating a virtual negative conductance element, a virtual inductor, and a virtual capacitor connected in parallel.

Example 7

The device of example 6, wherein: an inductance value, L, of the virtual inductor and a capacitance value, C, of the virtual capacitor are defined based on a switching frequency, such that $$\frac{1}{2\pi\sqrt{LC}}$$

is equal to the switching frequency and $0<\sqrt{L/C}<1$, and a negative conductance value of the virtual negative conductance element is a positive value.

Example 8

The device of example 6, wherein the processor is configured to implement the oscillator circuit by further emulating a virtual cubic voltage-dependent current source.

Example 9

The device of any of examples 1-8, wherein the control unit is further configured to: compare a voltage waveform outputted by the oscillator circuit to a zero-voltage reference to produce a square wave; integrate the square wave to produce a pulse width modulation (PWM) carrier wave; and generate the at least one switching signal based on a comparison of the PWM carrier wave and a duty ratio signal.

Example 10

The device of any of examples 1-9, wherein the processing unit is further configured to: scale the measured output current by a first gain value to produce a scaled output current; determine a derivative of the measured output current; combine the scaled output current and the derivative of the measured output current to produce a combined signal; and scale the combined signal by a second gain value to generate the current signal.

Example 11

The device of example 10, wherein: the DC-to-DC conversion circuit further comprises an output filter having a filter resistance value and a filter inductance value, the first gain value is greater than or equal to a ratio of the filter resistance value to the filter inductance value, and the second gain value is positive.

Example 12

The device of any of examples 1-8, wherein the processing unit is further configured to scale the measured output current by a gain value to generate the current signal.

Example 13

The device of example 12, wherein the processing unit is further configured to: combine a voltage waveform outputted by the oscillator circuit with a measured capacitor current to produce a combined oscillator output, wherein the measured capacitor circuit represents a current flowing through a capacitor in the oscillator circuit; compare the combined oscillator output to a zero-voltage reference to produce a square wave; integrate the square wave to produce a pulse width modulation (PWM) carrier wave; and generate the at least one switching signal based on a comparison of the PWM carrier wave and a duty ratio signal.

Example 14

A system comprising: a first DC conversion device comprising: a first control unit comprising a first oscillator circuit, the first control unit configured to generate, based on the first oscillator circuit, at least one first switching signal; and a first direct current (DC)-to-DC conversion circuit comprising a first at least one electronic switch that is operatively coupled to the first control unit, wherein the first DC-to-DC conversion circuit is configured to convert, based on the at least one first switching signal, a first DC input voltage to a first DC output voltage, wherein the first control unit is further configured to input, to the first oscillator circuit, a first current signal that is generated based on a measured output current of the first DC-to-DC conversion circuit; and a second DC conversion device comprising: a second control unit comprising a second oscillator circuit, the second control unit configured to generate, based on the second oscillator circuit, at least one second switching signal; and a second DC-to-DC conversion circuit comprising a second at least one electronic switch that is operatively coupled to the second control unit, wherein the second DC-to-DC conversion circuit is configured to convert, based on the at least one second switching signal, a second DC input voltage to a second DC output voltage, wherein the second control unit is further configured to input, to the second oscillator circuit, a second current signal that is generated based on a measured output current of the second DC-to-DC conversion circuit, wherein the first DC conversion device and the second DC conversion device are configured in parallel to output power to a load.

Example 15

The system of example 14, wherein: the first control unit comprises a first processor configured to implement the first oscillator circuit by emulating a first virtual negative conductance element, a first virtual inductor, and a first virtual capacitor connected in parallel, and the second control unit comprises a second processor configured to implement the second oscillator circuit by emulating a second virtual negative conductance element, a second virtual inductor, and a second virtual capacitor connected in parallel.

Example 16

The system of example 14, wherein: the first oscillator circuit comprises a first negative conductance element, a first inductor, and a first capacitor connected in parallel, and the second oscillator circuit comprises a second negative conductance element, a second inductor, and a second capacitor connected in parallel.

Example 17

The system of any of examples 14-16, wherein: the first control unit is further configured to: compare a voltage waveform outputted by the first oscillator circuit to a first zero-voltage reference to produce a first square wave; integrate the first square wave to produce a first pulse width modulation (PWM) carrier wave; and generate the at least one first switching signal based on a comparison of the first PWM carrier wave and a first duty ratio signal, and the second control unit is further configured to: compare a voltage waveform outputted by the second oscillator circuit to a second zero-voltage reference to produce a second square wave; integrate the second square wave to produce a second PWM carrier wave; and generate the at least one second switching signal based on a comparison of the second PWM carrier wave and a second duty ratio signal.

Example 18

The system of any of examples 14-17, wherein: the first processing unit is further configured to: scale the first measured output current by a first gain value to produce a first scaled output current; determine a derivative of the first measured output current; combine the first scaled output current and the derivative of the first measured output current to produce a first combined signal; and scale the first combined signal by a second gain value to generate the first current signal, and the second processing unit is further configured to: scale the second measured output current by a third gain value to produce a second scaled output current; determine a derivative of the second measured output current; combine the second scaled output current and the derivative of the second measured output current to produce a second combined signal; and scale the second combined signal by a fourth gain value to generate the second current signal.

Example 19

The system of any of examples 14-18, wherein the first control unit and the second control unit cause the first DC conversion device and the second DC conversion device to produce interleaved outputs during operation.

Example 20

The system of any of examples 14-19, wherein the at least one first switching signal and at least one second switching signal are generated not based on communications between the first DC conversion device and the second DC conversion device.

In one or more examples, the techniques described herein may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media, which includes any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable storage medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of inter-operative hardware units, including one or more processors as described above, in conjunction with suitable software and/or firmware.

The foregoing disclosure includes various examples set forth merely as illustration. The disclosed examples are not intended to be limiting. Modifications incorporating the spirit and substance of the described examples may occur to persons skilled in the art. These and other examples are within the scope of this disclosure and the following claims.

What is claimed is:

1. A device comprising:
a control unit comprising an oscillator circuit comprising a negative conductance element, an inductor, and a capacitor connected in parallel, the control unit configured to generate, based on the oscillator circuit, at least one switching signal; and
a direct current (DC)-to-DC conversion circuit comprising at least one electronic switch that is operatively coupled to the control unit, wherein the DC-to-DC conversion circuit is configured to convert, based on the at least one switching signal, a DC input voltage to a DC output voltage,
wherein the control unit is further configured to input, to the oscillator circuit, a current signal that is generated based on a measured output current of the DC-to-DC conversion circuit.

2. The device of claim 1, wherein:
an inductance value, L, of the inductor and a capacitance value, C, of the capacitor are defined based on a switching frequency, such that $$\frac{1}{2\pi\sqrt{LC}}$$

is equal to the switching frequency and $0<\sqrt{LC}<1$,
a negative conductance value of the negative conductance element is a positive value.

3. The device of claim 1, wherein the oscillator circuit further comprises a cubic voltage-dependent current source.

4. The device of claim 3, wherein a coefficient of the cubic voltage-dependent current source is a positive value.

5. The device of claim 1, wherein the control unit is further configured to:
compare a voltage waveform outputted by the oscillator circuit to a zero-voltage reference to produce a square wave;
integrate the square wave to produce a pulse width modulation (PWM) carrier wave; and
generate the at least one switching signal based on a comparison of the PWM carrier wave and a duty ratio signal.

6. The device of claim 1, wherein the control unit is further configured to:
scale the measured output current by a first gain value to produce a scaled output current;
determine a derivative of the measured output current;
combine the scaled output current and the derivative of the measured output current to produce a combined signal; and
scale the combined signal by a second gain value to generate the current signal.

7. The device of claim 6, wherein:
the DC-to-DC conversion circuit further comprises an output filter having a filter resistance value and a filter inductance value,
the first gain value is greater than or equal to a ratio of the filter resistance value to the filter inductance value, and
the second gain value is positive.

8. The device of claim 1, wherein the control unit is further configured to scale the measured output current by a gain value to generate the current signal.

9. The device of claim 8, wherein the control unit is further configured to:
combine a voltage waveform outputted by the oscillator circuit with a measured capacitor current to produce a combined oscillator output, wherein the measured capacitor circuit represents a current flowing through a capacitor in the oscillator circuit;
compare the combined oscillator output to a zero-voltage reference to produce a square wave;
integrate the square wave to produce a pulse width modulation (PWM) carrier wave; and
generate the at least one switching signal based on a comparison of the PWM carrier wave and a duty ratio signal.

10. A system comprising:
a first DC conversion device comprising:
a first control unit comprising a first oscillator circuit, the first control unit configured to generate, based on the first oscillator circuit, at least one first switching signal; and
a first direct current (DC)-to-DC conversion circuit comprising a first at least one electronic switch that is operatively coupled to the first control unit, wherein the first DC-to-DC conversion circuit is configured to convert, based on the at least one first switching signal, a first DC input voltage to a first DC output voltage,
wherein the first control unit is further configured to input, to the first oscillator circuit, a first current signal that is generated based on a measured output current of the first DC-to-DC conversion circuit; and
a second DC conversion device comprising:
a second control unit comprising a second oscillator circuit, the second control unit configured to generate, based on the second oscillator circuit, at least one second switching signal; and
a second DC-to-DC conversion circuit comprising a second at least one electronic switch that is operatively coupled to the second control unit, wherein the second DC-to-DC conversion circuit is configured to convert, based on the at least one second switching signal, a second DC input voltage to a second DC output voltage,
wherein the second control unit is further configured to input, to the second oscillator circuit, a second current signal that is generated based on a measured output current of the second DC-to-DC conversion circuit,
wherein the first DC conversion device and the second DC conversion device are configured in parallel to output power to a load, and
wherein the at least one first switching signal and at least one second switching signal are generated not based on communications between the first DC conversion device and the second DC conversion device.

11. The system of claim 10, wherein:
the first control unit comprises a first processor configured to implement the first oscillator circuit by emulating a first virtual negative conductance element, a first virtual inductor, and a first virtual capacitor connected in parallel, and
the second control unit comprises a second processor configured to implement the second oscillator circuit by emulating a second virtual negative conductance element, a second virtual inductor, and a second virtual capacitor connected in parallel.

12. The system of claim 10, wherein:
the first oscillator circuit comprises a first negative conductance element, a first inductor, and a first capacitor connected in parallel, and
the second oscillator circuit comprises a second negative conductance element, a second inductor, and a second capacitor connected in parallel.

13. The system of claim 10, wherein:
the first control unit is further configured to:
compare a voltage waveform outputted by the first oscillator circuit to a first zero-voltage reference to produce a first square wave;
integrate the first square wave to produce a first pulse width modulation (PWM) carrier wave; and
generate the at least one first switching signal based on a comparison of the first PWM carrier wave and a first duty ratio signal, and
the second control unit is further configured to:
compare a voltage waveform outputted by the second oscillator circuit to a second zero-voltage reference to produce a second square wave;
integrate the second square wave to produce a second PWM carrier wave; and
generate the at least one second switching signal based on a comparison of the second PWM carrier wave and a second duty ratio signal.

14. The system of claim 10, wherein:
the first control unit is further configured to:
scale the first measured output current by a first gain value to produce a first scaled output current;
determine a derivative of the first measured output current;
combine the first scaled output current and the derivative of the first measured output current to produce a first combined signal; and
scale the first combined signal by a second gain value to generate the first current signal, and
the second control unit is further configured to:
scale the second measured output current by a third gain value to produce a second scaled output current;
determine a derivative of the second measured output current;
combine the second scaled output current and the derivative of the second measured output current to produce a second combined signal; and
scale the second combined signal by a fourth gain value to generate the second current signal.

15. The system of claim 10, wherein the first control unit and the second control unit cause the first DC conversion device and the second DC conversion device to produce interleaved outputs during operation.

16. A device comprising:
a control unit comprising a processor configured to implement an oscillator circuit by emulating a virtual negative conductance element, a virtual inductor, and a virtual capacitor connected in parallel, the control unit configured to generate, based on the oscillator circuit, at least one switching signal; and
a direct current (DC)-to-DC conversion circuit comprising at least one electronic switch that is operatively coupled to the control unit, wherein the DC-to-DC conversion circuit is configured to convert, based on the at least one switching signal, a DC input voltage to a DC output voltage,
wherein the control unit is further configured to input, to the oscillator circuit, a current signal that is generated based on a measured output current of the DC-to-DC conversion circuit.

17. The device of claim 16, wherein:
an inductance value, L, of the virtual inductor and a capacitance value, C, of the virtual capacitor are defined based on a switching frequency, such that $$\frac{1}{2\pi\sqrt{LC}}$$

is equal to the switching frequency and $0<\sqrt{LC}<1$, and
a negative conductance value of the virtual negative conductance element is a positive value.

18. The device of claim 16, wherein the processor is configured to implement the oscillator circuit by further emulating a virtual cubic voltage-dependent current source.

* * * * *